(12) United States Patent
Wang et al.

(10) Patent No.: US 8,994,095 B2
(45) Date of Patent: *Mar. 31, 2015

(54) SEMICONDUCTOR MEMORY DEVICE WITH A BURIED DRAIN AND ITS MEMORY ARRAY

(75) Inventors: Pengfei Wang, Shanghai (CN); Qingqing Sun, Shanghai (CN); Shijin Ding, Shanghai (CN); Wei Zhang, Shanghai (CN)

(73) Assignee: Fudan University, Shanghai (CN)

( * ) Notice: Subject to any disclaimer, the term of this patent is extended or adjusted under 35 U.S.C. 154(b) by 0 days.

This patent is subject to a terminal disclaimer.

(21) Appl. No.: 13/322,640

(22) PCT Filed: Dec. 24, 2010

(86) PCT No.: PCT/CN2010/002152
§ 371 (c)(1),
(2), (4) Date: Jul. 19, 2012

(87) PCT Pub. No.: WO2011/075956
PCT Pub. Date: Jun. 30, 2011

(65) Prior Publication Data
US 2012/0273866 A1  Nov. 1, 2012

(30) Foreign Application Priority Data
Dec. 24, 2009  (CN) .......................... 2009 1 0200622

(51) Int. Cl.
*H01L 29/792* (2006.01)
*H01L 21/28* (2006.01)
*H01L 27/115* (2006.01)

(52) U.S. Cl.
CPC .... *H01L 21/28273* (2013.01); *H01L 27/11521* (2013.01)
USPC ........... 257/324; 257/314; 257/315; 257/316; 257/317; 438/257

(58) Field of Classification Search
CPC ............ H01L 29/792; H01L 29/66833; H01L 21/28273; H01L 29/66825; H01L 27/11563
USPC .......... 257/324, 314–317, E29.309; 438/216, 438/257
See application file for complete search history.

(56) References Cited

U.S. PATENT DOCUMENTS

| | | | |
|---|---|---|---|
| 5,324,973 A * | 6/1994 | Sivan | 257/330 |
| 2006/0033145 A1* | 2/2006 | Kakoschke et al. | 257/315 |
| 2014/0167134 A1* | 6/2014 | Wang et al. | 257/324 |

* cited by examiner

*Primary Examiner* — Theresa T Doan
(74) *Attorney, Agent, or Firm* — Niro, Haller & Niro

(57) ABSTRACT

A semiconductor memory device with a buried drain is provided. The device comprises a semiconductor substrate (107); one drain region (108) of a first doping type; two source regions (101a, 101b) of a second doping type; and a stacked gate provided on the semiconductor substrate for capturing electrons. A memory array formed by a plurality of semiconductor memory devices and a manufacturing method thereof are also provided. The semiconductor memory device has the advantages of small cell area, simple manufacturing process and the like. The manufacturing cost of the memory device is reduced and the storing density of the memory device is increased.

8 Claims, 4 Drawing Sheets a. Cut-section along the bit-line.

b. Cut-section along the word-line. The common drains are separated by STI.

c. Cut-section along the word-line. A common drain plate is used.

SEMICONDUCTOR MEMORY DEVICE WITH A BURIED DRAIN AND ITS MEMORY ARRAY

FIELD OF INVENTION

The present invention refers to a self-aligned vertical non-volatile semiconductor memory device and a contactless array composed by these memory devices. A method of forming the same is also disclosed in the present invention.

BACKGROUND OF THE INVENTION

Semiconductor memory chips are widely used in many fields such as industrial control and consuming electronics. High integration density, low power consumption, and high speed are essential properties of these memory chips. To enhance the storage capability of a memory chip in the same die area, generally there are two methods. One method is to scale down the feature size of the semiconductor memory cell. The second method is to get a better design by improving the architecture or applying novel devices. Due to the MOSFET-based structure in the electrically erasable programmable read only memory (EEPROM) and nitride read only memory (NROM), the short channel effects of MOSFET become handicaps as the feature size is scaled down in these memory cells. Therefore, a novel device structure with suppressed short channel effects is preferred. According to this requirement, a self-aligned vertical Tunneling-Field-Effect-Transistor Read only memory (TROM) is proposed in the present invention. Because of the suppressed short channel effects in a Tunneling-Field-Effect-Transistor (TFET) structure, the TROM can be scaled down to 20 nm gate length and the leakage current remains low.

The density of a memory chip can be improved by using a better design. An example is the application of NROM. The NROM has 2-bit storage in one memory cell. Therefore, the NROM has a higher storage density than that of EEPROM. Similar to NROM, the presently invented self-aligned vertical TROM cell has the 2-bit storage capability. The density of the vertical TROM will be higher than that of EEPROM.

The memory cells array is generally arranged in a matrix layout to realize the mass storage. There are two architectures in the EEPROM flash memory matrix. One architecture is the NAND architecture and the other is the NOR architecture, Using the NAND architecture, the memory density is higher than that of NOR architecture because that the source and drain contact pads are not necessary in the NAND architecture. Because of the self-aligned vertical structure of a memory cell, a new architecture that applies both the NOR architecture and the NAND architecture becomes possible in the present invention. The advantages of both NAND and NOR architectures are realized in the combined architecture.

BRIEF SUMMARY OF THE INVENTION

In the present invention, the inventors intend to enhance the density of the storage memory chip and lower the stand-by and the programming power consumption of a single memory device. The self-aligned vertical TROM and its contactless array are proposed in the present invention. The method of forming the device is also disclosed at the same time, A semiconductor memory device with a buried drain, compromising:
  a semiconductor substrate,
  a drain of a first conductivity,
  two sources of a second conductivity,
  and a gate stack with charge trapping layer to locally trap electrons.
  said substrate is intrinsic and said semiconductor substrate is lightly doped.
a gate with a stack is composed by:
  a first dielectric layer a width of bandgap covering the channel region,
  a second dielectric layer disposed over the said first dielectric layer and with narrower bandgap than that of the said first dielectric layer,
  and a third dielectric layer disposed over the said second dielectric layer and with wider bandgap than that of the said second dielectric layer,
  a conductive gate material disposed over the said third dielectric layer.
said substrate is a part of an Si wafer, an SiGe wafer or a strained Si wafer.

A semiconductor memory string with a buried drain compromising: plural semiconductor memory string configured by the semiconductor memory devices described in claim 1, and two NMOSFETs located at the both end of the string.
  the source electrodes of the said semiconductor memory devices are connected in series.
A TROM memory array, comprising a silicon substrate, and at least one semiconductor memory string.
  the drain is buried into the said semiconductor substrate and works as buried bitline.

DETAILED DESCRIPTION OF THE INVENTION

Figure 1:
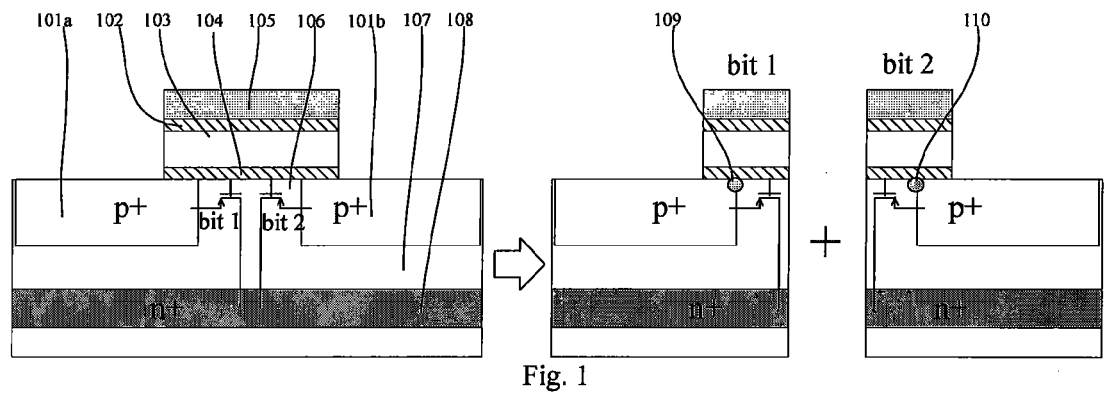
FIG. 1 Cross-sectional view of a self-aligned vertical TROM.

A single vertical TROM device is shown in FIG. 1, left. This device is built in a semiconductor substrate (107). The buried $n^+$ doped region (108) acts as the drain and the $p^+$ doped region acts as the source (101a, 101b). Over the channel region (106) between two $p^+$ doped source (101a., 101b), a gate stack with a first dielectric (104), a second dielectric (103), a third dielectric (102), and a gate metal (105) is formed.

To clearly illustrate the working principle, this cell is divided into two memory devices in FIG. 1, right. Both the left half cell and the right half cell can store one-bit information. As a positive gate voltage is applied, an electron channel (106) is created under the said first dielectric (104). As a result, a $p^+/n^+$ Esaki-tunnel junctions is formed at the location (109). When the left $p^+$ region (101a) is grounded and the $n^+$ region is positive biased (e.g. 2V), electrons will tunnel from the valence band to the conduction band at the left $p^+/n^+$ Esaki-tunnel junction. Depending on the gate voltage, a portion of the hot electrons at the tunneling junction can be injected into the first gate dielectric (104) and locally trapped in the second gate dielectric (103) like a ONO stack [6]. The trapped charges will change the threshold voltage and the left part of this memory cell is programmed. In the same way, the right part of the memory device can also be programmed. Therefore, two-bit information can be stored in one memory cell.

Figure 2:
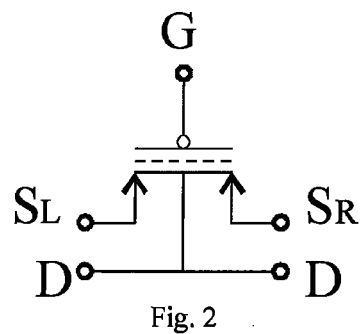
FIG. 2 Electrical symbol for a self-aligned vertical TROM.

The electrical symbol for this self-aligned vertical TROM is shown in FIG. 2. There are two storage units in a vertical TROM cell. The left TROM storage unit is composed by the left source ($S_L$), the common drain (D), and the common gate (G). The right TROM unit consists of the right source ($S_R$), the common drain, and the common gate as well. As the left TROM unit is activated the positive gate voltage, electrons will tunnel from the left source ($S_L$) to the channel. Then, these electrons are collected by the common drain. As the right TROM unit is activated with the positive gate voltage, the electrons tunnel from the right source ($S_R$) to the common drain with a positive gate voltage.

The erase function is realized by the injection of channel hot holes. The $p^+$ doped source (101a or 101b) is positive biased and the gate (105) is negative biased during the erasing process. Hot holes will be generated and the information stored can be erased.

Figure 3:
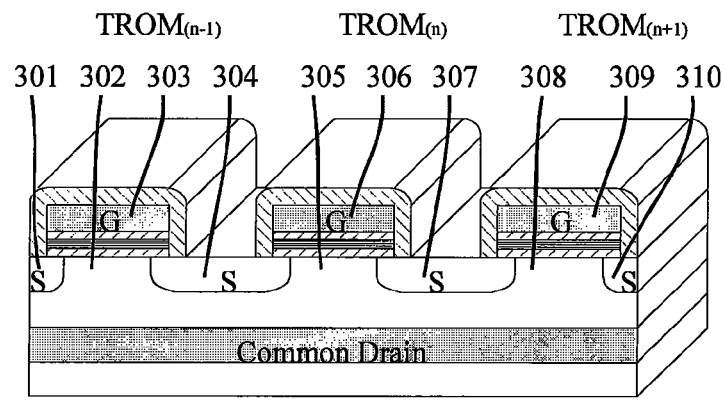
FIG. 3 An example for storing and accessing two bits in a TROM.

Several TROM cells are shown in FIG. 3 to explain how to access two bits from a TROM cell. There are three TROM cells in FIG. 3. They are $TROM_{(n-1)}$, $TROM_{(n)}$, and $TROM_{(n+1)}$.

The left source (301) of $TROM_{(n-1)}$ is grounded during reading. When the channel (302) of $TROM_{(n-1)}$ is conductive and other channels (305,308) are not conductive, the left part of $TFET_{(n)}$ is activated and the right part of $TFET_{(n)}$ is deactivated. The $n^+$ doped common drain is positive-biased. When the gate (306) is positive-biased, electrons flow from the $p^+$ source (304) to the $n^+$ drain by tunneling mechanism. The tunneling current density depends on the density and location of trapped charges in the said second dielectric, named the charge-trapping layer. In the same manner, the right part $TROM_n$ can be activated. Thus, the stored 2-bit information can be recognized separately.

Figure 4:
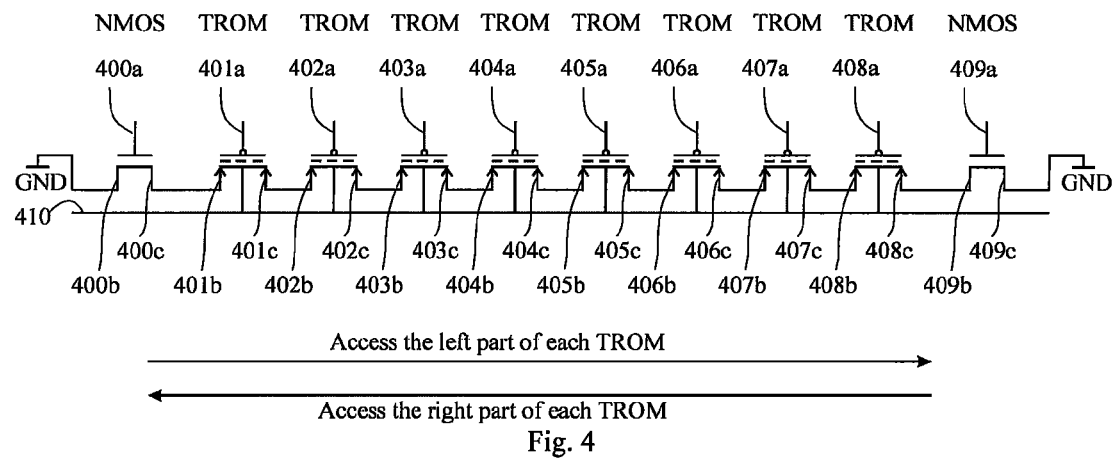
FIG. 4 A 16-bit string composed by eight TROM cells.

Based on the TROM cell shown in FIG. 2 and FIG. 3, an 8-TROM string is composed as an example and shown in FIG. 4. There are two NMOSFETs at the ends of the memory string. The source of the left NMOS (400b) and the source of the right NMOS (409c) are grounded. The bit-line (410) is positive-biased.

As explained by FIG. 3, the 2-bit information stored in a TROM, is accessed in two directions. In FIG. 4, when the gate of the left NMOS (400a) is positive-biased while the gate of the right NMOS (409a) is grounded, the string is accessed from left to right in sequence, vice verse. For example, the TROM source 401b will be grounded when the gate 400a is positively-biased. A vertical TROM cell composed by gate 401a, drain 410, and source 401b is then active and the information stored inside it can be accessed. The stored information can be read-out by sensing the current flowing through the common drain. Then, the gate 401a is negative-biased so that the ground-voltage will be transferred to the source of the next vertical TROM (402b). The TROM cell composed by gate 402a, drain 410, and source 402b is active and the information can be read or written. Then the gate 402a is turned to negative voltage. The similar procedure will continue and the all the left part of each TROM can be accessed. During this process, the right side NMOS 409 is switched off. The current in the bit-line (410) can be detected and the state of each TROM is able to be recognized. To access the right part of each TROM, the left side NMOS 400 is switched off while the right side NMOS 409 is switch on. Then the TROM cells are accessed from right to left sequentially.

The memory string shown in FIG. 4 realizes 16 bit storage using 8 TROM cells. The similar string with n (n=1, 2, 3 . . . ) TROM cells can realize 2n bit storage. In this string shown in FIG. 4, the TROM sources are connected using a NAND architecture. However, the TROM units are connected using a NOR architecture. Because of the vertical structure, this NOR architecture doesn't cost additional area for contact. The combination of NAND and NOR architecture takes the advantage of. NAND for fast reading and high density. It also takes the advantage of NOR architecture for the fast single bit access.

The most particular property of this TROM storage string during operation is that the electrons are injected from the $p^+$ region to the channel region, and then collected by the $n^+$ common drain. The current flows from the $n^+$ doped drain to the $p^+$ doped source. That means the electrons are injected into the reverse-biased p-i-n diode. The detection of this electron injection is similar to the detection of photo-generated electrons. As proved by the high frequency applications as photo detectors, the reverse-biased p-i-n diode has a fast detection of the non-equilibrium carriers. That makes TROM a memory device with very high detection speed.

Figure 5:
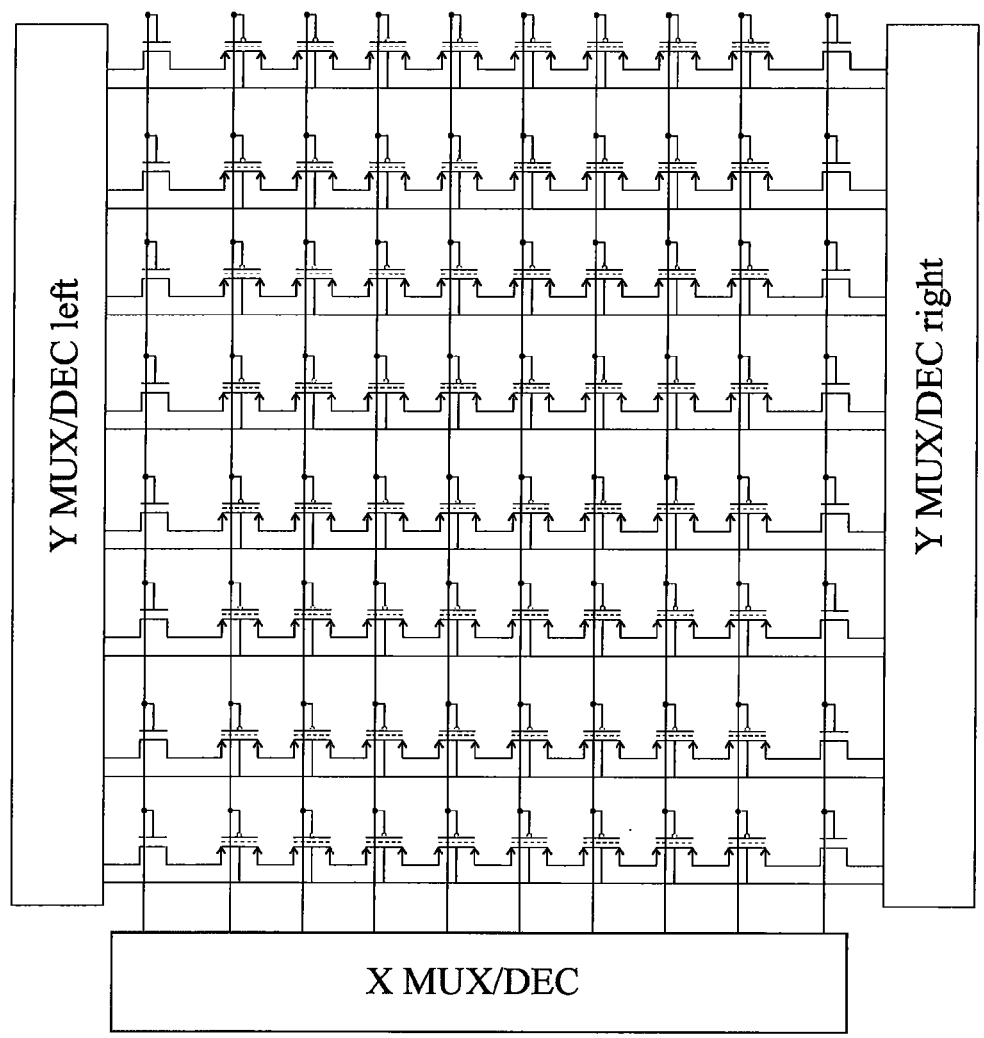
FIG. 5 The 8×8 memory array configured by TROM strings. This array is able to store 16×8 bit data.

Using the memory string shown in FIG. 4, the layout of a TROM array is proposed and shown in FIG. 5. The word-line connects the gates in the same column and then connected to the X MUX/DEC. The bit-line and the source of NMOS are connected to the Y MUX/DEC. The peripheral logic circuits are needed to realize the necessary algorithms of X and Y MUX/DEC for reading and writing the core memory array. FIG. 5 shows an 8×8 TROM array having a 128 bit capability. The n×n TROM array can be configured using the same principle. Because of the low power consumption property of TROM device, the TROM array is able to do parallel read and write. That will enhance the operating speed of this array.

The merits of implementing the present invention is summarized as the following:

Firstly, as shown in FIG. 1, a p-i-n structure is designed in this device, as suppresses the short channel effect of TFET. The simulation study shows that TFET has better scalability than MOSFET. That means that higher density memory can be realized by using TFET device than other types of MOSFET-based memory such as NROM.

Secondly, TROM has a low off leakage current, as will enable low standby power consumption. Further, TROM has a high write efficiency. Simulation shows that the TROM device can be programmed with very small drain current. That means that the TROM device has low program power consumption. Thus, TROM is attractive for low power applications. On the contrary, NROM needs higher drain current to program a memory cell and its power consumption is higher than the TROM memory device proposed in the present invention.

Thirdly, the proposed TROM can store two bits inside a single memory device, the storage ability is doubled. As a result, the area for storing a single bit is reduced. The drain is buried into the substrate in a TROM device. The TROM cell size is further reduced compared to the conventional EEPROM and NROM memory devices.

Finally, TROM combines the structure of NAND and NOR and each bit can be accessed directly and promptly. The tunneling mechanism will also enhance the reading speed.

In the following the manufacturing method of forming the disclosed TROM array will be described.

Figure 6:
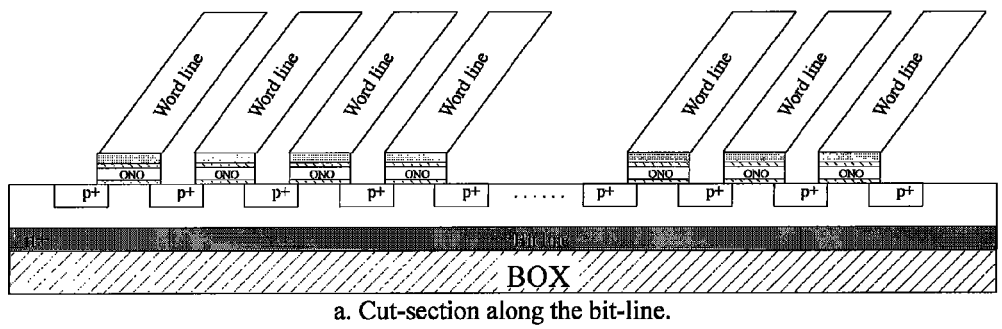
FIG. 6 Cross-section of a TROM array.
Figure 6:
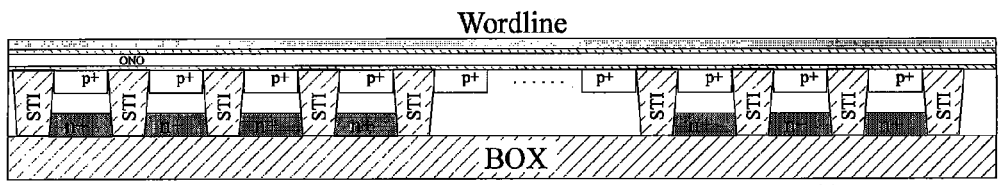
Figure 6:
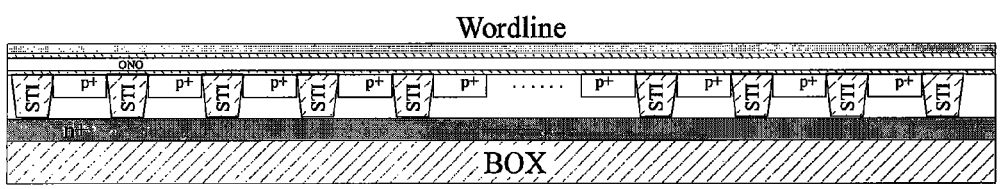

The contactless TROM array can be fabricated using the standard CMOS technology. FIG. 6.*a* shows the cross-section along the bit-line of a TROM array. The $p^+$ regions can be formed using the self-aligned process. A buried $n^+$ common drain can be formed by ion implantation. The common drain can be separated by Shallow Trench Isolation (STI). The cross-section along the word-line of a TROM array with separated common drain can be seen in FIG. 6.b. The common drain can be a plate as well. FIG. 6.c shows the cross-section along the word-line of a TROM array with a common drain plate.

Figure 7:
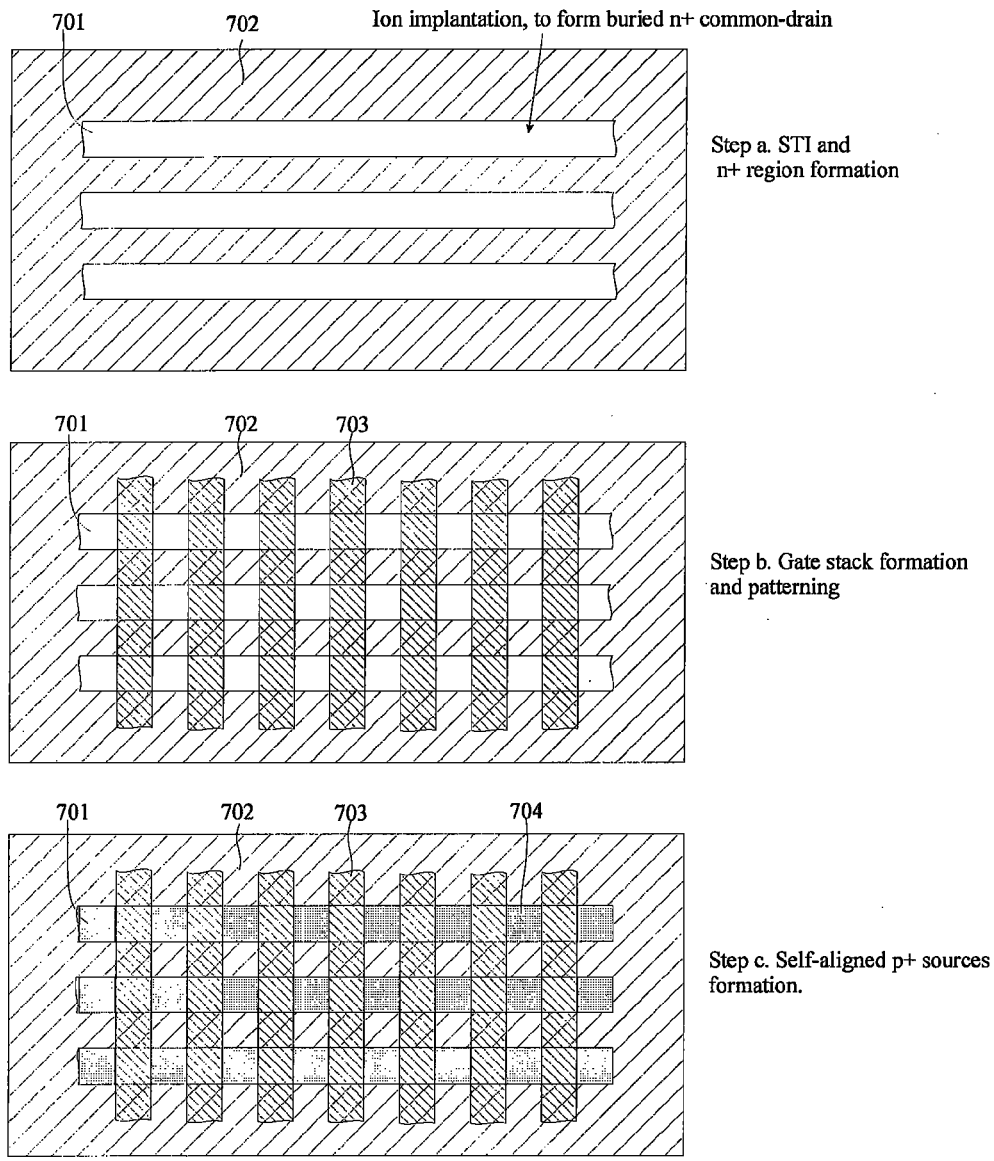
FIG. 7 Top-down view of a TFET array.

The top-down views of the TROM array during the fabrication processes are shown in FIG. 7. The substrate (702) is n doped or intrinsic. In step a, the STI is formed and the active area is opened. Then an n+ buried layer (701) is formed (preferably by ion implantation). The bit-line can be separated by the shallow trench isolation. Next, in step b, the word-line gate stack (703) is formed and patterned. In step c, a p-type ion implantation will result in the self-aligned p+ pads. To adjust the threshold voltage of the PMOS, an additional threshold voltage adjustment process may be necessary. The following processes such as passivation, metallization, and interconnection are the same to the conventional VLSI processes.

Figure 8:
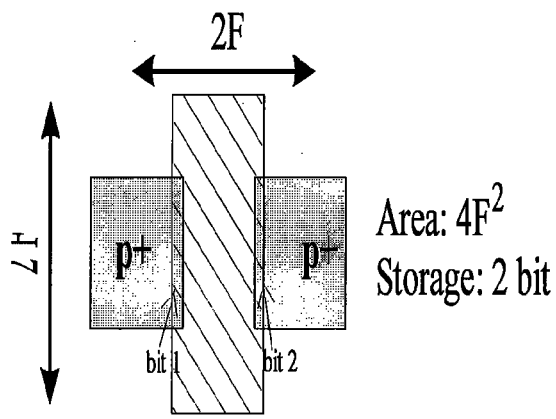
FIG. 8 Top-down view of a self-aligned vertical TROM storage cell.

As can be seen in FIG. 8, a TROM cell realizes 2-bit storage using 4F$^2$ area. The high density memory array can be fabricated.

What is claimed:

1. A semiconductor memory device with a buried drain, comprising:
   a semiconductor substrate (107),
   a drain of a first conductivity (108),
   two sources of a second conductivity (101a, 101b),
   and a gate stack with charge trapping layer to locally trap electrons, the gate stack having:
   a first dielectric layer (104) with a width of bandgap covering the channel region (106),
   a second dielectric layer (103) disposed over the said first dielectric layer (104) and with narrower bandgap than that of the said first dielectric layer (104),
   and at third dielectric layer (102) disposed over the said second dielectric layer (103) and with wider bandgap than that of the said second dielectric layer (103), and,
   a conductive gate material (105) disposed over the said third dielectric layer.

2. A TROM memory string having a plurality of semiconductor memory devices with buried drains, comprising:
   a semiconductor substrate wherein said substrate is intrinsic and is lightly doped (107),
   a drain of a first conductivity (108),
   two sources of a second conductivity (101a, 101b),
   a gate stack with charge trapping layer to locally trap electrons,
   and two NMOSFETs located at both ends of the TROM memory string.

3. A TROM memory string having a plurality of semiconductor memory devices with buried drains, comprising:
   a semiconductor substrate (107),
   a drain of a first conductivity (108),
   two sources of a second conductivity (101a, 101b),
   a gate stack with charge trapping layer to locally trap electrons and wherein said gate stack includes,
   a first dielectric layer (104) with a width of bandgap covering the channel region (106),
   a second dielectric layer (103) disposed over the said first dielectric layer (104) and with narrower bandgap than that of the said first dielectric layer (104),
   and a third dielectric layer (102) disposed over the said second dielectric layer (103) and with wider bandgap than that of the said second dielectric layer (103),
   a conductive gate material (105) disposed over the said third dielectric layer,
   and two NMOSFETs located at both ends of the TROM memory string.

4. A TROM memory string having a plurality of semiconductor memory devices with buried drains, comprising:
   a semiconductor substrate wherein said substrate is part of an Si wafer, an SiGe wafer or a strained Si wafer (107),
   a drain of a first conductivity (108),
   two sources of a second conductivity (101a, 101b),
   a gate stack with charge trapping layer to locally trap electrons,
   and two NMOSFETs located at both ends of the TROM memory string.

5. A TROM memory string having a plurality of semiconductor memory devices with buried drains, composing:
   a semiconductor substrate (107),
   a drain of a first conductivity (108),
   two sources of a second conductivity (101a, 101b),
   a gate stack with charge trapping layer to locally trap electrons,
   and two NMOSFETs located at both ends of the TROM memory string.

6. The TROM memory string according to claims 5, 2, 3 or 4 wherein the source electrodes or said semiconductor memory devices are connected in series.

7. A TROM memory array, comprising a silicon substrate, and at least one semiconductor memory string according to claims 5, 6, 2, 3 or 4.

8. The TROM memory array of claims 5, 6, 7, 2, 3, or 4 wherein the drain is buried into said semiconductor substrate and works as a buried bitline.

* * * * *